US009058932B2

(12) United States Patent
Ebersberger et al.

(10) Patent No.: US 9,058,932 B2
(45) Date of Patent: Jun. 16, 2015

(54) CAPACITOR SYSTEM AND METHOD FOR PRODUCING A CAPACITOR SYSTEM

(76) Inventors: Frank Ebersberger, Altdorf (DE); Peter Beckedahl, Oberasbach (DE); Hartmut Kulas, Ebermannstadt (DE); Peter Schott, Nürnberg (DE)

(*) Notice: Subject to any disclaimer, the term of this patent is extended or adjusted under 35 U.S.C. 154(b) by 409 days.

(21) Appl. No.: 13/291,081

(22) Filed: Nov. 7, 2011

(65) Prior Publication Data

US 2013/0113074 A1    May 9, 2013

(51) Int. Cl.
| | |
|---|---|
| *H01G 4/00* | (2006.01) |
| *H01G 2/08* | (2006.01) |
| *H01L 49/02* | (2006.01) |
| *H01G 2/10* | (2006.01) |
| *H05K 7/20* | (2006.01) |
| *H01G 4/224* | (2006.01) |

(52) U.S. Cl.
CPC . *H01G 2/08* (2013.01); *Y10T 29/43* (2015.01); *H01L 28/40* (2013.01); *H01G 2/10* (2013.01); *H05K 7/20927* (2013.01); *H01G 4/224* (2013.01)

(58) Field of Classification Search
CPC ....................................................... H01G 4/248
USPC ....................................................... 361/301.3
See application file for complete search history.

(56) References Cited

U.S. PATENT DOCUMENTS

| | | | |
|---|---|---|---|
| 5,373,418 A | 12/1994 | Hayasi | |
| 6,262,876 B1 | 7/2001 | Schimanek | |
| 6,885,538 B1 * | 4/2005 | Ishii et al. | 361/301.3 |
| 2009/0195957 A1 | 8/2009 | Grimm et al. | |
| 2010/0014252 A1 | 1/2010 | Hamatani | |
| 2011/0100598 A1 | 5/2011 | Gömmel et al. | |
| 2013/0114210 A1 * | 5/2013 | Ebersberger et al. | 361/702 |

FOREIGN PATENT DOCUMENTS

| | | |
|---|---|---|
| CA | 2329327 | 10/1999 |
| DE | 93 12 006 | 9/1993 |
| DE | 198 17 493 | 8/1999 |
| DE | 10 2005 031 367 | 11/2007 |
| DE | 10 2009 044 368 | 5/2011 |
| EP | 0 994 494 | 4/2000 |
| JP | 2007123572 | 5/2007 |
| WO | WO 02/35899 | 5/2002 |

* cited by examiner

*Primary Examiner* — Stephen W Smoot
(74) *Attorney, Agent, or Firm* — The Law Offices of Roger S. Thompson

(57) ABSTRACT

A capacitor system and a method for producing a capacitor system. The capacitor system may be used in a power semiconductor module. In one embodiment, the capacitor system comprises a metal shaped body having a depression; a capacitor arranged at least partly in the depression; a spacer composed of electrically insulating material, the spacer being arranged at least partly between the capacitor and the metal shaped body in the depression; and an electrically insulating potting material provided in the depression, wherein the potting material fixes the capacitor in the depression so that the capacitor does not touch the metal shaped body.

9 Claims, 4 Drawing Sheets

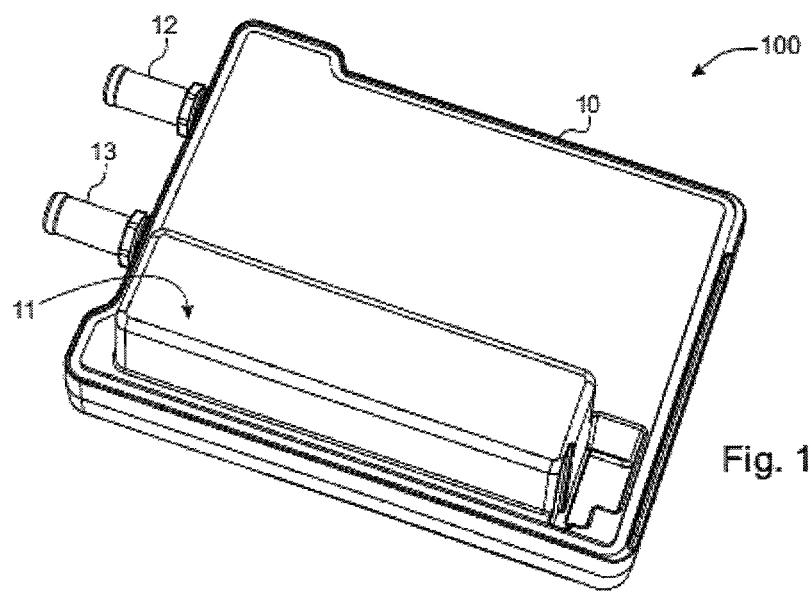
Fig. 1
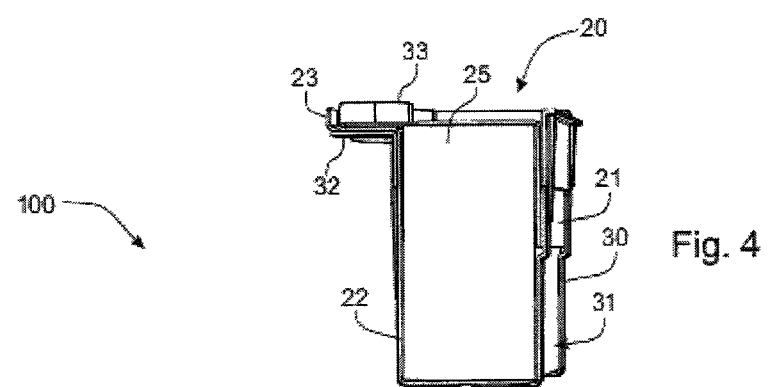
Fig. 4
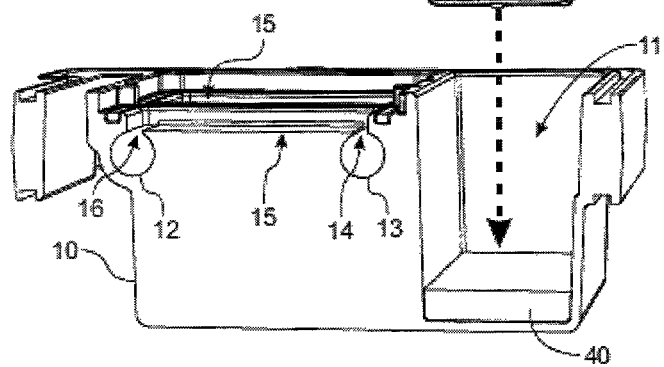

CAPACITOR SYSTEM AND METHOD FOR PRODUCING A CAPACITOR SYSTEM

BACKGROUND OF THE INVENTION

1. Field of the Invention

The present invention is directed to a capacitor system and to a method for producing a capacitor system, and, more particularly, to a capacitor system used in a power semiconductor module.

2. Description of the Related Art

Capacitors are common electrical components often used in power electronics, inter alia in voltage intermediate circuits of converters or as filters. The demands made upon such power electronic systems with regard to manufacturing costs, size and reliability of the system are continuously increasing. In this context, EP 0 994 494 discloses a low-inductance film capacitor, which can be integrated into an intermediate circuit construction of converters and which may also be manufactured compactly and reliably. In this case, the reference discloses in particular, making contact with the capacitor on one side for the purpose of accurate placement on cooling areas.

SUMMARY OF THE INVENTION

It is an object of the invention to provide an improved capacitor system and a method for producing such an improved capacitor system. More particularly, the invention is directed to a capacitor system for use in a power semiconductor module.

According to the present invention, there is provided, inter alia, fixing a housing-free capacitor structure by means of a potting compound in a trough-shaped depression of a metallic heat sink suitable for cooling a power semiconductor circuit, wherein the capacitor structure is arranged in a basket-shaped plastic frame functioning as a spacer and the potting compound electrically insulates the capacitor structure, hereinafter referred to simply as a "capacitor", from the heat sink. In this fashion, the capacitor may be made more compact than heretofore.

The inventive capacitor system includes a metal shaped body having a depression, a capacitor arranged at least partially in the depression, and an electrically insulating potting material provided in the depression, which potting material positions the capacitor in the depression so that the capacitor does not touch the metal shaped body and is therefore electrically insulated therefrom.

The metal shaped body fosters the dissipation of the heat developed in the capacitor. Alternatively, however, the metal shaped body could also consist of a comparably robust and thermally conductive non-metallic material.

The term "potting material" is understood hereinafter to refer to a material which can be converted from a liquid state into a permanently solid state, often designated as a "cured" state. This conversion can be effected passively, for example by means of a chemical reaction of the liquid potting material with air, or else can be brought about actively for example by admixing a chemical reactant with the liquid potting material or by irradiating the liquid potting material with UV light. This conversion, often called "curing", usually lasts from several seconds to a few hours.

The potting material can be a material which, despite its electrically insulating property, has a better thermal conductivity than air, for example better by a factor of about 10 to about 100. Consequently, the potting material can serve both to electrically insulate the capacitor from the metal shaped body and to produce a continuous heat transfer between the capacitor and the metal shaped body in a simple manner. This electrical insulation is achieved both by the positioning—ensured permanently by the potting material, after its curing—of the capacitor at a position spaced apart from the metal shaped body and by the electrically insulating property of the potting material. In this case, it should be noted that the potting material can be introduced in a liquid state between the capacitor and the metal shaped body to fix the capacitor relative to the metal shaped body in its cured state.

The liquid potting material can be introduced between capacitor and the metal shaped body by being introduced into the depression before the capacitor. In this case, the potting material is displaced by the capacitor when the capacitor is introduced into the depression so that the potting material fills the space between the capacitor and the metal shaped body partly, but preferably completely, i.e. in accordance with the amount of potting material. This introduction of the liquid potting material between the capacitor and the metal shaped body can likewise be effected by the potting material, after the capacitor has been introduced into the depression, likewise being poured, injected under pressure or sucked by means of vacuum, into the depression in the space between the capacitor and the metal shaped body. For injection, it is possible to provide at least one corresponding injection opening in a side wall of the depression. During injection, the potting material, as a result of the pressure used, is pressed between the capacitor and the metal shaped body even when the distance between the capacitor and the metal shaped body is small or, for example measured in comparison to the dielectric strength to be achieved by the potting material between the capacitor and the metal shaped body, minimal.

The depression constitutes a housing at least partly surrounding the capacitor and can simultaneously serve as a vessel for receiving the potting material in its liquid state, which can simplify the production of the capacitor system. The depression can correspondingly be trough-shaped. The depression can be of a size such that the capacitor, if appropriate, together with a spacer as described below, can be completely received therein, or merely of a size such as to receive only a part of the capacitor. The respective dimensions of the depression are intended to be selected so that it is possible to receive the capacitor in the depression without the capacitor touching the metal shaped body. The depression can be dimensioned so that it is possible for the capacitor to be enveloped completely—with the exception of the capacitor connections—with potting material within the depression. The dimensions of the depression, and thus the distance between the capacitor and the metal shaped body, should be selected so that the potting material disposed between the capacitor and the metal shaped body has a desired dielectric strength and also achieves a desired level of heat transfer between the capacitor and the metal shaped body.

Furthermore, the capacitor system can have a spacer composed of electrically insulating material, the spacer being arranged at least partly between the capacitor and the metal shaped body, for example at least partly in the depression between the capacitor and the metal shaped body. The spacer can thus correctly position the capacitor relative to the metal shaped body, especially during the curing of the potting material, thus simplifying the production of the capacitor system. Since the spacer is produced from electrically insulating material, the capacitor is insulated from the metal shaped body.

The capacitor can have at least two metallic contact electrodes and a layered stack of at least two electrodes and a dielectric. The construction of capacitors having a plurality of capacitor layers arranged directly adjacent to one another, wherein each capacitor layer has a dielectric arranged between two planar electrodes, is well known to those skilled in the art. In particular, the dielectric can be realized by a plastic film or a similarly film-like dielectric material (for example insulating paper), for which reason such a capacitor is often referred to as a "film capacitor". The associated electrodes can be realized by vapor-depositing a metal layer on the plastic film. A film capacitor usually has a very compact design and a dielectric strength that is suitably high for a power electronic application. The contact electrodes can be arranged directly on a respective outer area of the layered stack. As a result, a parallel connection of some or all of the individual capacitor layers can be achieved in a manner known to one skilled in the art. The contact electrodes can serve as capacitor connections for contact—connecting the capacitor to an external circuit. However, the capacitor connections that are electrically connected to the contact electrodes, and regularly also with low impedance, can also be formed separately from the contact electrodes. The contact electrodes can form at least one part of an outer area of the capacitor.

The spacer can be directly adjacent to the layered stack and/or at least one of the contact electrodes and/or the metal shaped body. The spacer can have at least one opening, and the capacitor system can be designed so that the potting material flows through the opening to form a substantially continuous connection and hence permit heat transfer between the capacitor and the metal shaped body. The spacer can be a hollow body shaped for snugly receiving the capacitor. The hollow body can have a wall thickness of less than about 1 or 2 mm. The spacer can have at least substantially the form of a parallelepipedal basket. The spacer can have outer walls wherein the openings make up more than half or even more than about 80% or 90% of the area of the respective outer wall. The depression can be designed for snugly receiving the spacer.

The features described in the preceding paragraph contribute both individually and synergistically to the fact that the capacitor can be arranged very close to the metal shaped body in the region of the depression with the reproducible reliability necessary for commercial production, without current-carrying elements of the capacitor coming into contact with the metal shaped body, and the fact that it is possible to likewise reliably provide very good heat transfer between the capacitor and the metal shaped body in the region of the depression.

The depression and the spacer can be formed so that one part of the spacer projects from the depression even when another part of the spacer is arranged substantially in a form-fitting manner and as far as possible in the depression. In this way, it is possible, in particular, to electrically insulate the metal shaped body from those parts of the capacitor which project from the depression or from the potting material. The spacer can have projections on an upper edge thereof—projecting from the depression, which projections are substantially perpendicular to a side wall of the spacer. Such projections can form an electrically insulating structure preventing electrical contact between an upper area of the metal shaped body and current carrying lines, such as the capacitor connections or the connections—connected to the capacitor connections—of a power semiconductor circuit.

The metal shaped body can be formed as a heat sink, for example as a ribbed and/or liquid-cooled heat sink, more particularly as a water-cooled heat sink. The capacitor system can be part of a power semiconductor module comprising a power semiconductor circuit. The capacitor system can be part of the power semiconductor circuit. The power semiconductor circuit can be arranged at the metal shaped body in such a way that the metal shaped body acts as a heat sink for the power semiconductor circuit. The metal shaped body and the heat transfer between the metal shaped body and the power semiconductor circuit can be designed so that at least about 70%, 80% or even 90% of the waste heat generated by the power semiconductor circuit during rated operation thereof can be dissipated by the metal shaped body upon the cooling of the metal shaped body to less than about 40° C.

The contact electrodes and the capacitor layers of a capacitor are usually encapsulated in a housing in accordance with the prior art, inter alia to protect the capacitor layers against mechanical damage and the contact electrodes against undesirable electrical contact. Capacitors encapsulated in this way were then sold and installed as individual elements. In accordance with one teaching of the present disclosure, such encapsulation of the capacitor by the manufacturer is avoided. The thus unhoused capacitor is instead arranged in a metal shaped body which not only mechanically protects the capacitor but also fulfils a function relevant to the user's application of the capacitor. By way of example, the metal shaped body can function as a heat sink for the capacitor itself and/or for a power semiconductor circuit connected to the capacitor. In this way, the structural size of a power semiconductor circuit requiring comparatively large capacitors can be significantly reduced. Moreover, it is possible to simplify the cooling and the mounting of such a power semiconductor circuit with large capacitors.

As described above, the capacitor system can be part of a power semiconductor module comprising a power semiconductor circuit. In this case, the power semiconductor circuit can have contact connections that are electrically conductively connected, preferably welded, directly to the contact electrodes of the capacitor. In this way, the mounting of such a power semiconductor circuit with large capacitors is simplified. On account of the proximity between the power semiconductor circuit and the capacitor, which is necessarily dictated by such a welding, joint cooling of the power semiconductor circuit and of the capacitor is additionally fostered, without the structural size of the power semiconductor module having to increase disproportionately.

A power semiconductor circuit within the meaning of the present disclosure can be a circuit comprising at least one semiconductor component having a rated voltage of greater than about 100 V or even greater than about 600 V. A power semiconductor circuit within the meaning of the present disclosure be a circuit which can be used to switch a current path between a first potential and a second potential depending on at least one control signal selectively between a substantially closed (low-impedance) state and a substantially open (high-impedance) state, wherein a difference between the first potential and the second potential is more than about 100 V or even more than about 600 V, or wherein a current flowing in the closed state regularly via the current path is more than about 100 A or even more than about 1000 A.

Even though the features described in this disclosure are explained in connection with a capacitor system, all disclosed features should, of course, be regarded as likewise disclosed for a method for producing a capacitor system.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is described below on the basis of exemplary embodiments explained in greater detail with reference to the drawings, in which like reference numerals refer to like elements and in which:

FIG. 1 is a perspective view of the underside of a metal shaped body for a capacitor module in accordance with a first embodiment of the invention;

FIG. 4 is a schematic cross section through a metal shaped body for the capacitor module of FIG. 3.

DETAILED DESCRIPTION OF THE PRESENTLY PREFERRED EMBODIMENT

Figure 2:
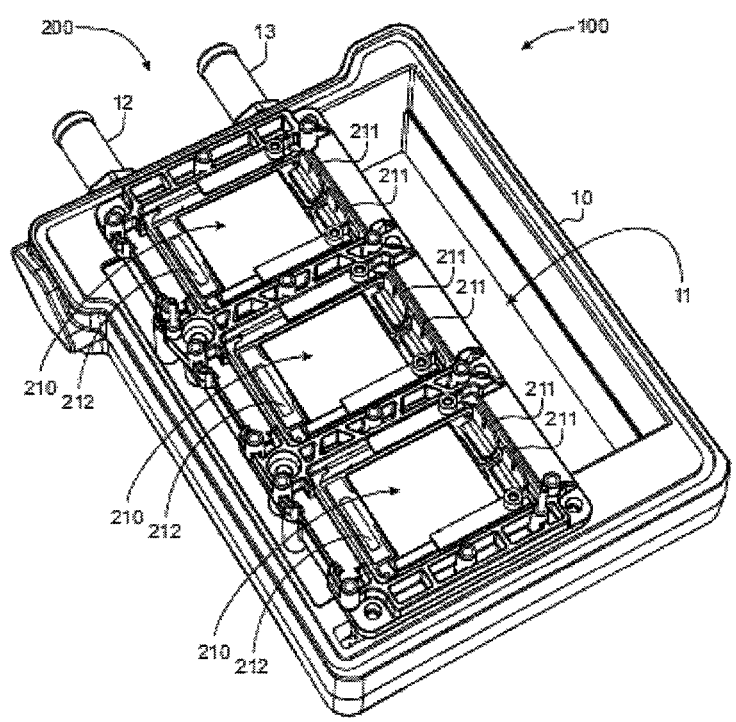
FIG. 2 is a first perspective view of the top side of the metal shaped body of FIG. 1.

FIG. 1 shows a perspective view of the underside of a metal shaped body 10 for a capacitor module 100 in accordance with a first embodiment of the invention, the individual elements of which, in a departure from the drawings, can also assume a configuration as described above. Metal shaped body 10 has a depression 11 configured to receive a capacitor 20 (not shown in FIG. 1). Metal shaped body 10 is embodied as a liquid-cooled heat sink and has a liquid inlet 12 and a liquid outlet 13 for guiding the cooling liquid.

FIG. 2 shows a first perspective view of the top side of the metal shaped body 10 for capacitor module 100 in accordance with the embodiment of FIG. 1, wherein capacitor module 100 forms a part of a power semiconductor module 200. In this sense, power semiconductor circuits 210 are arranged on metal shaped body 10 so that metal shaped body 10 functions as a heat sink for power semiconductor circuits 210. Power semiconductor circuits 210 have first connections 211, via which it is possible to produce a direct electrical contact with the respective contacts 23, 24—not shown in FIG. 2—of capacitor 20—likewise not shown in FIG. 2. Power semiconductor circuits 210 also have second connections 212, embodied here as an AC voltage connection.

In the illustration in FIG. 2, capacitor module 100 is not yet equipped with a capacitor 20. Like FIG. 1, FIG. 2 shows a depression 11 designed for receiving capacitor 20, a liquid inlet 12 and a liquid outlet 13 for passing through a cooling liquid for cooling metal shaped body 10.

Figure 3:
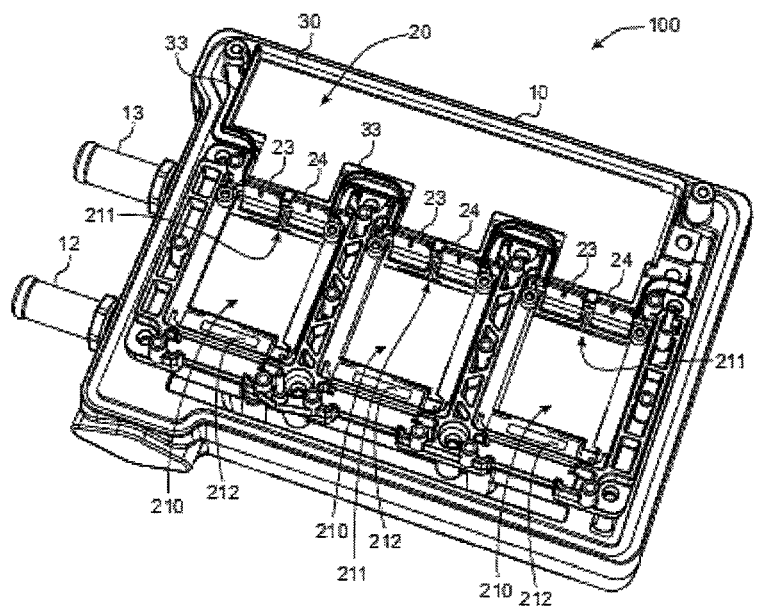
FIG. 3 is a second perspective view of the top side of a capacitor module such as shown in FIG. 1.

FIG. 3 shows a second perspective view of the top side of a capacitor module 100 in accordance with the embodiment of FIG. 1, wherein capacitor module 100 forms part of a power semiconductor module 200. As already disclosed in FIG. 2, power semiconductor circuits 210 in the illustration in FIG. 3 are arranged on metal shaped body 10 so that metal shaped body 10 functions as a heat sink for power semiconductor circuits 210. Power semiconductor circuits 210 have first connections 211, via which it is possible to produce a direct electrical contact, for example by welding, with contacts 23, 24 of capacitor 20.

Like FIGS. 1 and 2, FIG. 3 shows a liquid inlet 12 and a liquid outlet 13 for guiding a cooling liquid for cooling metal shaped body 10.

In the illustration in FIG. 3, capacitor module 100 is equipped with a capacitor 20, which is arranged in a depression 11 (not visible in the illustration of FIG. 3) of metal shaped body 10.

Capacitor 20 is arranged in a basket-shaped spacer 30—scarcely visible in the illustration in FIG. 3—composed of electrically insulating material. Moreover, capacitor 20 is impressed in an electrically insulating potting material 40 (not visible in the illustration in FIG. 3) provided in depression 11 is such a way that potting material 40 together with spacer 30 substantially completely envelops and electrically insulates capacitor 20 with the exception of the capacitor contacts 23, 24. Some sections 33 of spacer 30 project beyond the upper area of potting material 40 and thus provide mechanical protection to some upper regions of capacitor 20 and also provide further electrical insulation.

FIG. 4 shows a schematic cross section through a metal shaped body 10 for a capacitor module 100 in accordance with the embodiment of FIG. 1. Metal shaped body 10 is provided with a liquid inlet 12 and a liquid outlet 13 for guiding a cooling liquid for cooling metal shaped body 10. In this case, the cooling liquid can flow in from liquid inlet 12 through an opening 14 into a cavity 15 in metal shaped body 10 and can flow from cavity 15 through an opening 16 into liquid outlet 13.

Metal shaped body 10 has a depression 11 configured to receive a capacitor 20 arranged in a basket-shaped spacer 30 composed of electrically insulating material. Depression 11 is partly filled with an electrically insulating, still liquid, potting material 40, into which capacitor 20 together with spacer 30 can be impressed. In this case, potting material 40 is displaced in such a way that potting material 40 together with spacer 30 completely fills a continuous region of the space between capacitor 20 and metal shaped body 10. The size of this region is dependent, of course, on the amount of potting material 40. If enough potting material 40 is present in depression 11, then capacitor 20, with the exception of capacitor contacts 23, 24, is completely enveloped and electrically insulated. Spacer 30 has a projection 32, which electrically insulates capacitor contact 23 from metal shaped body 10. Some sections 33 of spacer 30 project beyond the upper area of potting material 40 and provide mechanical protection to some upper regions of capacitor 20 and also provide further electrical insulation.

Capacitor 20 has, in a manner as described above, at least two metallic contact electrodes 21, 22 and a layered stack 25 of at least two electrodes and a dielectric. Contact electrodes 21, 22 form a part of the outer area of capacitor 20. A prong-shaped section of the respective contact electrode 21, 22 serves as a capacitor connection 23, 24.

Spacer 30 is formed as a hollow body for snugly receiving capacitor 20. A large part of the outer walls of spacer 30 is opened by openings 31. Spacer 30 is consequently substantially basket-shaped. Optional projections 32 are provided at an upper edge of spacer 30. Projections 32 can act as electrically insulating current-carrying lines running between respective capacitor contacts 23, 24 and the respective connections 211—not illustrated in FIG. 4—of a power semiconductor circuit 210 from metal shaped body 10. The fact that projections 32 are provided on spacer 30 and, consequently, do not have to be mounted as separate elements onto metal shaped body 10, simplifies the mounting of power semiconductor module 200.

Figure 5:
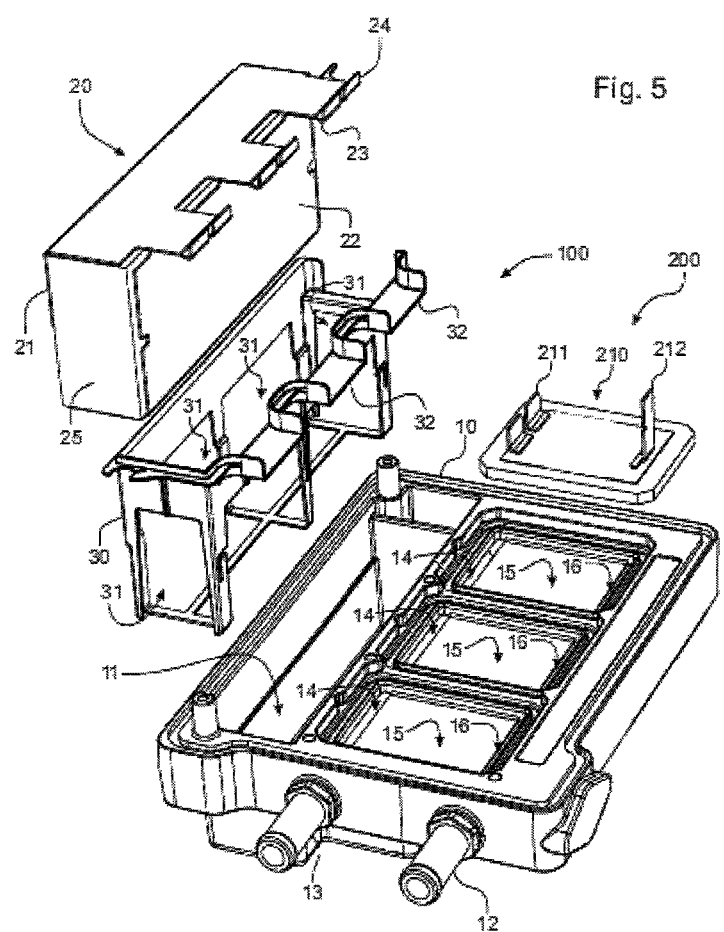
FIG. 5 is a schematic exploded drawing of the capacitor module of FIG. 3.

FIG. 5 shows a schematic exploded drawing of a capacitor module 100 in accordance with the embodiment of FIG. 1, wherein capacitor module 100 forms part of a power semiconductor module 200. Capacitor module 100 has a metal shaped body 10, a capacitor 20 and a spacer 30 formed of an electrically insulating material.

Metal shaped body 10 has a depression 11 to receive capacitor 20 with spacer 30.

As illustrated in FIG. 5, power semiconductor circuits 210 of the power semiconductor module 200 can be arranged on metal shaped body 10 so that metal shaped body 10 acts as a heat sink for power semiconductor circuits 210. In this case, a cooling liquid fed to the metal shaped body 10 via a liquid inlet 12 can flow via an inlet opening 14, which is connected to liquid inlet 12 by means of a first liquid line (not shown), into a cavity 15 in metal shaped body 10 and can flow out again from cavity 15 via an outlet opening 16, which is connected to liquid outlet 13 by a second liquid line (not shown). An underside of power semiconductor circuit 210, the underside being electrically insulated from the current-carrying elements of the power semiconductor circuit 210, can cover cavity 15 so that the cooling liquid flows along the underside of power semiconductor circuit 210, and that the cooling liquid cannot escape from cavity 15. This provides very good dissipation of the waste heat that arises in power semiconductor circuit 210.

Capacitor 20 has, in a manner as described above, at least two metallic contact electrodes 21, 22 and a layered stack 25 of at least two electrodes and a dielectric. The contact electrodes 21, 22 form a part of the outer area of capacitor 20. A prong-shaped section of the respective contact electrode 21, 22 serves as a capacitor connection 23, 24.

Spacer 30 is preferably formed as a hollow body for snugly receiving capacitor 20. A large part of the outer walls of spacer 30 is opened by openings 31. Spacer 30 consequently has a corresponding basket-shape. Optional projections 32 are provided at an upper edge of spacer 30. Projections 32 can electrically insulate current-carrying lines running between the respective capacitor connections 23, 24 from the respective connections 211 of a power semiconductor circuit 210 from metal shaped body 10. The fact that projections 32 are provided on spacer 30 and, consequently, do not have to be mounted as separate elements onto metal shaped body 10 simplifies the mounting of power semiconductor module 200.

Power semiconductor module 200 shown in FIG. 5 is distinguished by very simple mounting. A potting material 40 (not shown in FIG. 5) is introduced into depression 11 as shown (by way of example) in FIG. 4. Spacer 30 and capacitor 20 are subsequently pressed into depression 11. While spacer 30 prevents capacitor 20, the outer areas of which are current-carrying at least in part, if not even over the whole area, from coming into contact with the side walls of the depression 11, i.e., with metal shaped body 10, the potting material fills the space between capacitor 20 and metal shaped body 10 due to the resulting displacement by spacer 30 and capacitor 20. Capacitor 20 is electrically insulated from metal shaped body 10 by potting material 40 together with spacer 30. After potting material 40 is cured, capacitor 20 and spacer 30 are permanently fixed in depression 11. As shown in FIG. 5, capacitor connections 23, 24 are formed so that they are arranged, after the mounting of capacitor 20 in depression 11, so close to connections 211 of power semiconductor circuits 210 mounted on metal shaped body 10 that capacitor connections 23, 24 can be welded directly to connections 211 of power semiconductor circuit 210 to produce an electrical contact between capacitor 20 and power semiconductor circuits 210.

It should be explicitly pointed out at this juncture that the embodiments illustrated in the figures can be modified in any manner described in this disclosure. It should additionally be pointed out at this juncture that all the features described above as seen by themselves and in any combination, in particular the details illustrated in the drawings, can be claimed as essential to the invention. Modifications thereof are familiar to the person skilled in the art.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A capacitor system comprising:
a metal shaped body having a depression therein;
an unhoused capacitor arranged at least partly in said depression;
a spacer composed of electrically insulating material, said spacer being arranged at least partly between said unhoused capacitor and said metal shaped body in said depression; and
an electrically insulating potting material provided in said depression; and
wherein said spacer and said potting material position said capacitor in said depression so that said capacitor does not touch said metal shaped body and is electrically insulated from said metal shaped body;
wherein said spacer has at least one opening; and
wherein said potting material forms a continuous connection through said opening and thereby permits heat transfer between said capacitor and said metal shaped body.

2. The capacitor system of claim 1,
wherein said capacitor has at least two metallic contact electrodes and a layered stack of at least two electrodes and a dielectric,
wherein said contract electrodes are arranged directly on a respective outer area of said layered stack; and
wherein said contact electrodes form at least one part of an outer area of said capacitor.

3. The capacitor system of claim 2, wherein said spacer is directly adjacent to at least one of: said layered stack; at least one of said contact electrodes and said metal shaped body.

4. A capacitor system comprising:
a metal shaped body having a depression therein;
an unhoused capacitor arranged at least partly in said depression;
a spacer composed of electrically insulating material, said spacer being arranged at least partly between said unhoused capacitor and said metal shaped body in said depression; and
an electrically insulating potting material provided in said depression; and
wherein said spacer and said potting material position said capacitor in said depression so that said capacitor does not touch said metal shaped body and is electrically insulated from said metal shaped body; and wherein said spacer is a hollow body configured to snugly receive said capacitor.

5. The capacitor system of claim 4,
wherein said capacitor has at least two metallic contact electrodes and a layered stack of at least two electrodes and a dielectric,
wherein said contract electrodes are arranged directly on a respective outer area of said layered stack; and
wherein said contact electrodes form at least one part of an outer area of said capacitor.

6. The capacitor system of claim 5, wherein said spacer is directly adjacent to at least one of: said layered stack; at least one of said contact electrodes and said metal shaped body.

7. A capacitor system; comprising:
a metal shaped body having a depression therein;
an unhoused capacitor arranged at least partly in said depression;
a spacer composed of electrically insulating material, said spacer being arranged at least partly between said unhoused capacitor and said metal shaped body in said depression; and
an electrically insulating potting material provided in said depression; and
wherein said spacer and said potting material position said capacitor in said depression so that said capacitor does not touch said metal shaped body and is electrically insulated from said metal shaped body; and
wherein said metal shaped body is a water-cooled heat sink.

8. The capacitor system of claim 7,
wherein said capacitor has at least two metallic contact electrodes and a layered stack of at least two electrodes and a dielectric,
wherein said contract electrodes are arranged directly on a respective outer area of said layered stack; and
wherein said contact electrodes form at least one part of an outer area of said capacitor.

9. The capacitor system of claim 8, wherein said spacer is directly adjacent to at least one of: said layered stack; at least one of said contact electrodes and said metal shaped body.

* * * * *